United States Patent
Guitton et al.

(10) Patent No.: US 6,952,142 B2
(45) Date of Patent: Oct. 4, 2005

(54) FREQUENCY-SELECTIVE BALUN TRANSFORMER

(75) Inventors: Fabrice Guitton, Tours (FR); François Dupont, Tours (FR)

(73) Assignee: STMicroelectronics S.A., Montrouge (FR)

( * ) Notice: Subject to any disclaimer, the term of this patent is extended or adjusted under 35 U.S.C. 154(b) by 105 days.

(21) Appl. No.: 10/731,978

(22) Filed: Dec. 10, 2003

(65) Prior Publication Data

US 2004/0169566 A1 Sep. 2, 2004

(30) Foreign Application Priority Data

Dec. 13, 2002 (FR) .............................. 02 15836

(51) Int. Cl.[7] .............................................. H03H 7/42
(52) U.S. Cl. ........................... 333/25; 333/26; 333/177
(58) Field of Search ............................ 333/25, 26, 177

(56) References Cited

U.S. PATENT DOCUMENTS 6,788,164 B2 * 9/2004 Maekawa et al. ............. 333/26
6,803,835 B2 * 10/2004 Frank .......................... 333/26
6,850,127 B2 * 2/2005 Sakakura et al. ............. 333/25

FOREIGN PATENT DOCUMENTS

WO          WO 02/23719 A1     3/2002

* cited by examiner

*Primary Examiner*—Dean Takaoka
(74) *Attorney, Agent, or Firm*—Lisa K. Jorgenson; David V. Carlson; Seed IP Law Group PLLC

(57) ABSTRACT

A mode-switching transformer selective on a band centered on a first frequency, comprising, between a same common mode input/output terminal and respectively one of two differential mode input/output terminals, a high-pass filter with a cut-off frequency smaller than said first frequency, a band-pass filter with a central frequency greater than said first frequency.

11 Claims, 3 Drawing Sheets

FREQUENCY-SELECTIVE BALUN TRANSFORMER

BACKGROUND OF THE INVENTION

1. Field of the Invention

The present invention relates to the field of transformers used to convert a voltage from the common mode into a differential mode and conversely. Such transformers are generally called "balun" transformers, for "balanced-unbalanced".

2. Discussion

FIG. 1 very schematically shows an example of a balun transformer 1 in an application environment. This may be, for example, a portable phone transmission chain. This type of application currently uses balun-type devices since, on the antenna side, a single-end device is most often involved.

Transformer 1 is essentially formed of coupled inductive windings. A first winding is formed of two sections L1 and L2 in series and of same values, the junction point 2 of which forms the junction point (generally the ground) of differential mode inputs/outputs 3 and 4 of the transformer. A first end of winding L2 forms common mode input/output terminal 5 while the other end is in the air. A second winding is formed of two sections L3 and L4 of same values, in series, having their end terminals defining input/output terminals 3 and 4 on the differential mode side. Sections L1 and L2 are respectively coupled to sections L3 and L4. Junction point 6 of sections L3 and L4 receives a bias voltage Vp (D.C. component) of the transformer via an inductance L5, a capacitor C5 connecting terminal 6 to ground 2. Each terminal 3 and 4 is connected to a terminal TXA and TXB of a radiofrequency transceiver circuit 10 by a respective inductance L6 and L7. Further, terminals 3 and 4 are respectively connected to terminal 2 by capacitors C6 and C7. Inductances L6, L7 and capacitors C6, C7 form an impedance matching circuit between the differential balun impedance and the input impedance of circuit 10.

To make such a mode-switching transformer selective, a filter 11 connects input/output terminal 5 on the common mode side to transceiver antenna 12. Filter 11 is a band-pass filter which, especially in radiofrequency transceiver applications of mobile telephony type, must be selective.

To gain space, it has already been provided to form a mode-switching transformer of balun type by means of two respectively low-pass and high-pass filters formed based on capacitive and inductive elements.

FIG. 2 shows the electric diagram of such a conventional transformer 20. It shows a common mode input/output terminal 5 and two differential mode input/output terminals 3 and 4.

The actual transformer is formed of two inductances L21 and L22 and of four capacitors C21 to C24. Inductance L21 is in series with capacitor C21 between terminals 5 and 3, their junction point being grounded via capacitor C23. Capacitor C22 is in series with capacitor C24 between terminals 5 and 4, their junction point being grounded by inductance L22.

The setting of the D.C. component of the differential signal is provided on each of terminals 3 and 4 by voltage sources Vp, respectively 25 and 26. Two inductances L25 and L26 connect the positive electrodes of sources 25 and 26 to terminals 3 and 4, respectively. The function of inductances L25 and L26 is to serve as a trap to avoid for the dynamic signal crossing the mode-switching transformer to reach their power supplies. Capacitors C21 and C24 prevent the D.C. component from reaching terminal 5.

The branch formed of inductance L21 and of capacitor C23 forms a low-pass filter, while the branch formed of capacitor C22 and of inductance L22 forms a high-pass filter. The filters are sized to have a same cut-off frequency (frequency at which the attenuation corresponds to −3 dB). Further, each filter introduces a 90° phase shift in the common mode signal applied on terminal 5 with, however, an inverted sign according to the output terminal 3 or 4. Accordingly, a 180° phase shift is effectively obtained at the cut-off frequency between terminals 3 and 4.

FIG. 3 effectively illustrates the frequency response of gain G of the mode-switching transformer of FIG. 2 according to frequency f. In this example, the two curves LP and HP, respectively corresponding to the frequency responses of the high-pass and low-pass filters, cross at a 2.45-GHz frequency for which the attenuation is −3 dB. This frequency thus corresponds to the central frequency of the mode-switching transformer.

The imbalance between the two differential mode inputs/outputs as soon as it is departed from the 2.45-Gigahertz frequency limits the use range of such a balun. This imbalance is linked to the fact that the phase shift by more or less 90° is only maintained on a band which is limited, but adapted to most applications.

Another disadvantage is that two inductances L21 and L22 are necessary to form the filters. Further, two additional inductances L25 and L26 are necessary to cause the biasing.

SUMMARY OF THE INVENTION

The present invention aims at providing a frequency-selective mode-switching transformer. In particular, the present invention aims at providing a transformer which applies a common-mode filter towards the differential mode, in the passband of which the phase shift between the inputs/outputs of the differential mode is substantially constant, and the bulk of which is minimized.

The present invention also aims at providing a transformer structure compatible with the assembly of a D.C. component on the differential mode side.

To achieve these and other aims, the present invention provides a mode-switching transformer selective on a band centered on a first frequency, comprising, between a same common mode input/output terminal and respectively one of two differential mode input/output terminals, a high-pass filter with a cut-off frequency smaller than said first frequency; and a band-pass filter with a central frequency greater than said first frequency.

According to an embodiment of the present invention, the two filters are connected by an inductive coupling.

According to an embodiment of the present invention, the high-pass filter is of the second order.

According to an embodiment of the present invention, the central frequency of the band-pass filter is smaller than 1.5 times said first frequency.

According to an embodiment of the present invention, the cut-off frequency of the high-pass filter is greater than 0.5 times the first frequency.

According to an embodiment of the present invention, the band-pass filter comprises, between an input terminal of the filter and one of said differential mode input/output terminals, a first inductance, a second inductance being in parallel with a first capacitor between said input/output terminal and the ground.

According to an embodiment of the present invention, the high-pass filter comprises a first capacitor having a first electrode connected to an input terminal of the filter and a second electrode connected, by a first inductance, to ground; and a second capacitor having a first electrode connected to the junction point of the first capacitor and of the first inductance and having a second electrode connected to one of said differential mode input/output terminals and, by a second inductance, to ground.

According to an embodiment of the present invention, the first inductances of the band-pass and high-pass filters are coupled together and have a same value.

According to an embodiment of the present invention, the second inductances of the band-pass and high-pass filters are formed by a transmission line, the value of which conditions the central frequency of the band-pass filter.

According to an embodiment of the present invention, the value of the second inductance of the high-pass filter is a function of the cut-off frequency expected for this filter.

According to an embodiment of the present invention, the input terminal of the filters is common.

The foregoing objects, features, and advantages of the present invention will be discussed in detail in the following non-limiting description of specific embodiments in connection with the accompanying drawings.

DETAILED DESCRIPTION

Figure 1:
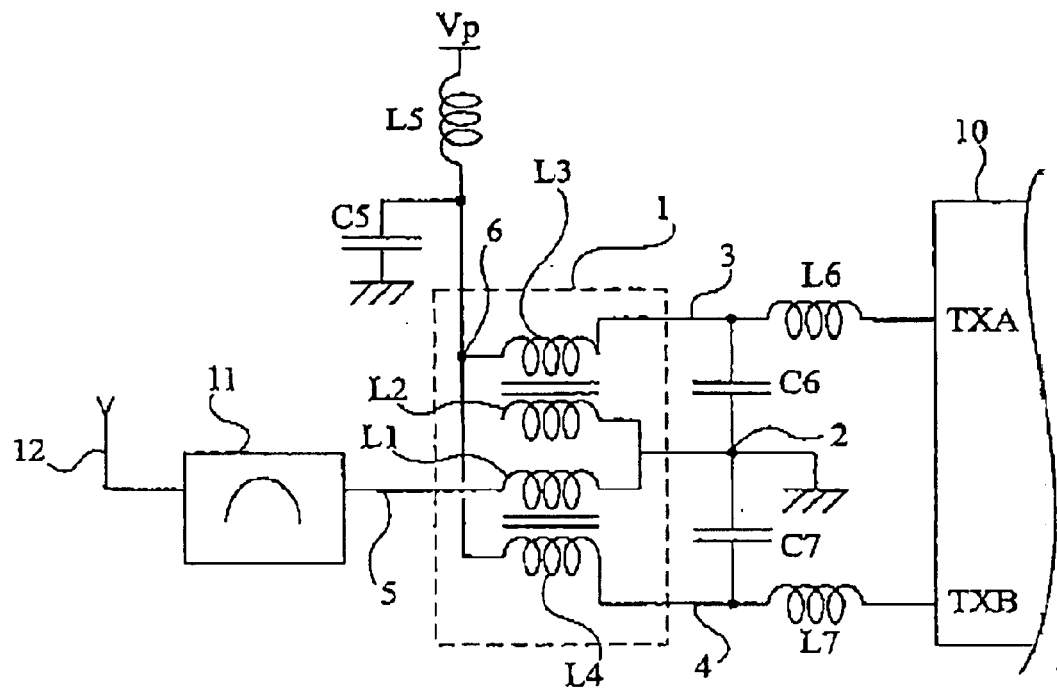
FIG. 1, previously described, very schematically shows an example of application of a known mode-switching transformer.
Figure 2:
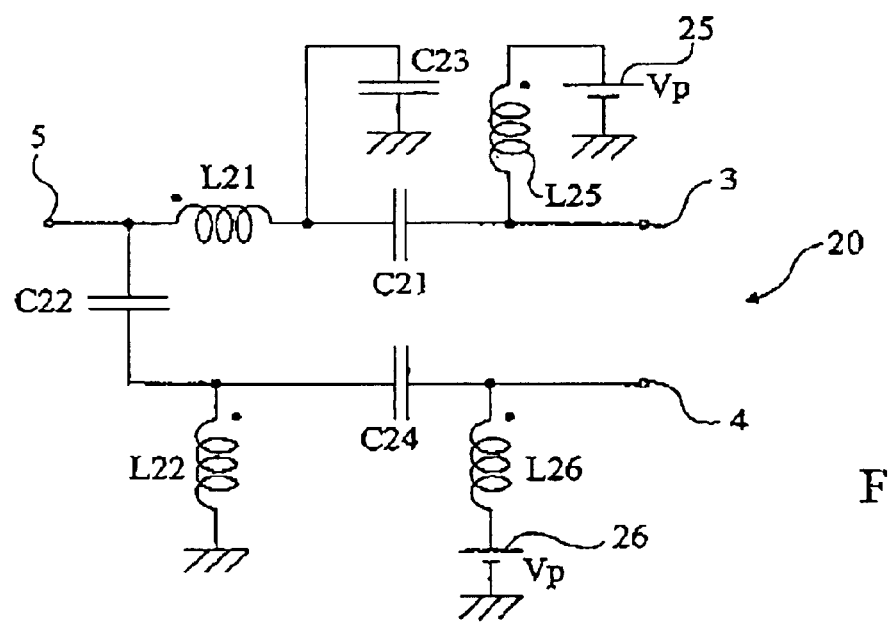
FIG. 2, previously described, shows a conventional example of a mode-switching transformer.
Figure 3:
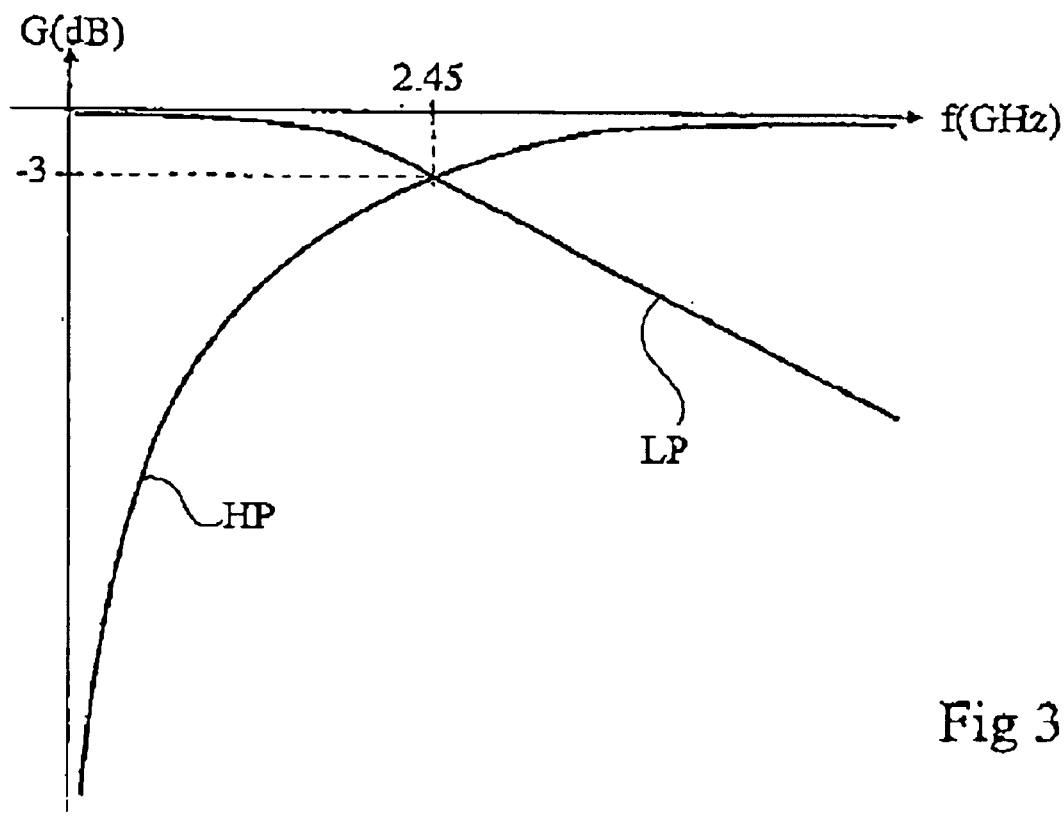
FIG. 3, previously described, illustrates the frequency response of the transformer of FIG. 2.

Same elements have been referred to with same reference numerals in the different drawings. For clarity, only those elements which are necessary to the understanding of the present invention have been shown in the drawings and will be described hereafter. In particular, the destination of the signals on the common mode side and on the differential side has not been detailed. Further, although the present invention more specifically applies to radiofrequency transmission mode-switching transformers, this is only a non-limiting example of application.

A feature of the present invention is to associate a high-pass filter and a band-pass filter to form a frequency-selective mode-switching transformer. Another feature of the present invention is to provide a high-pass filter of second order to obtain a 180° phase-shift while the band-pass filter has a zero phase-shift at the resonance frequency.

Further, for bulk reasons, the two filters may be coupled by means of an inductance as will be seen hereafter.

Figure 4:
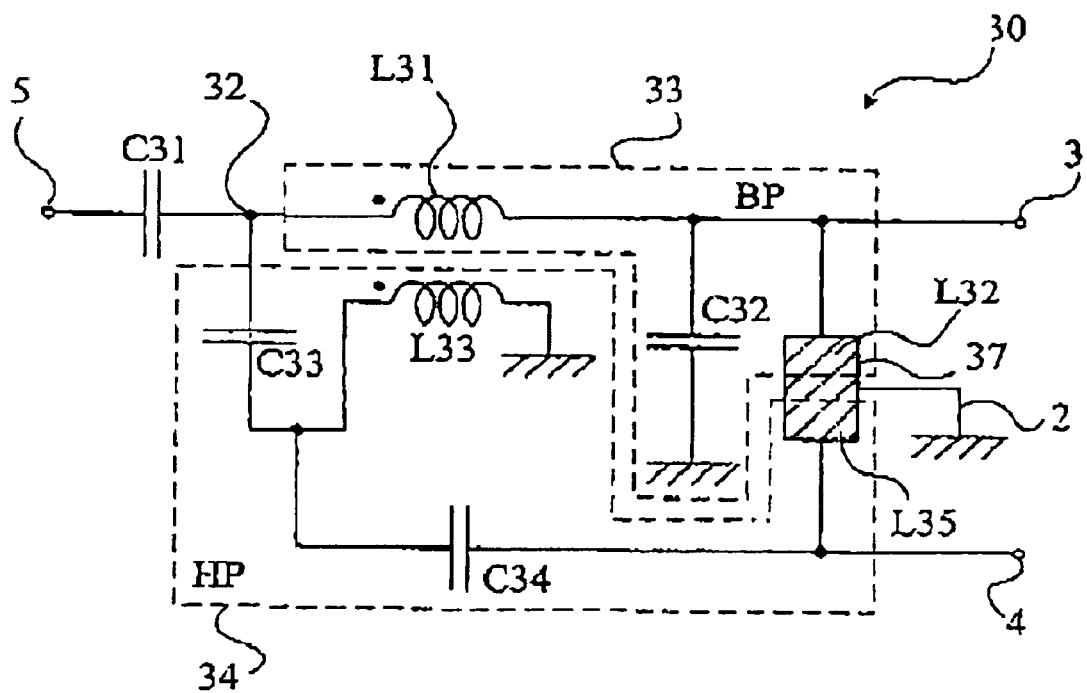
FIG. 4 shows an embodiment of a mode-switching transformer according to the present invention.

FIG. 4 shows a mode-switching transformer 30 according to an embodiment of the present invention. For simplification in this explanation, FIG. 4 does not illustrate possible D.C. component biasings, but these may be added.

Each differential mode input/output terminal 3 or 4 is associated with one of the filters among high-pass filter 34 (HP) and band-pass filter 33 (BP). In the shown example, and arbitrarily, terminal 3 is associated with the band-pass filter while terminal 4 is associated with the high-pass filter. On the side of common mode input/output terminal 5, a capacitor C31 connects terminal 5 to a common input terminal 32 of the two filters.

Band-pass filter 33 comprises an inductance L31 having a terminal connected to terminal 32 and having its other terminal directly connected to terminal 3. A capacitor C32 connects terminal 3 to ground 2 of the differential mode. A transmission line or inductance 37, formed, for its low-pass filter portion of an inductance L32 as will be seen hereafter, connects terminal 3 to ground 2.

High-pass filter 34 is a second order filter. It comprises a capacitor C33 having a first electrode connected to terminal 32 and a second electrode connected, via a capacitor C34, to terminal 4 and, via an inductance L33, to ground 2. Terminal 4 is further connected by transmission line L34 to terminal 3, which amounts to saying that an inductance L35 connects terminal 4 to terminal 2.

According to a preferred embodiment of the present invention, inductances L31 and L33 are coupled. The coupling factor ranges, for example, between 0 and ±1, and preferably is −0.7.

Figure 5:
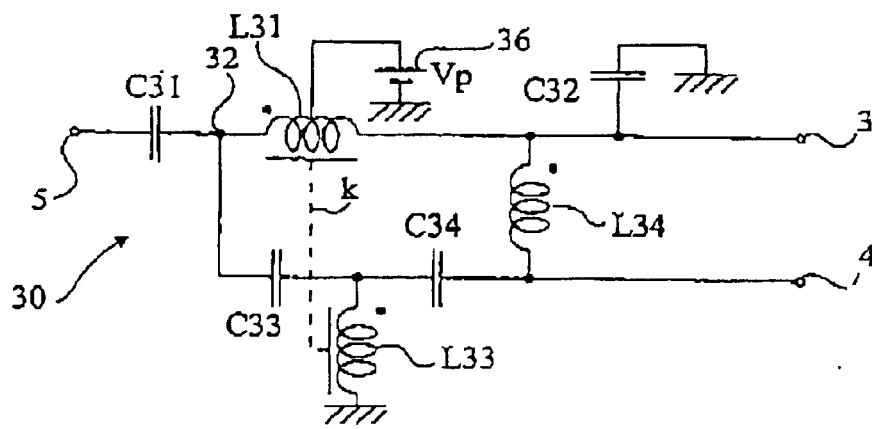
FIG. 5 illustrates the electric diagram of the transformer of FIG. 4 in static operation.

FIG. 5 shows the electric diagram of mode-switching transformer 30 of FIG. 4, by providing a bias voltage setting a D.C. component Vp by means of a source 36. In the representation of FIG. 5, coupling k between inductances L31 and L33 has been shown by a dotted line connecting them. It shows, otherwise, the same components as in FIG. 4 except that transmission line or inductance 37 has been shown in the form of an inductance L34 (L34=L32+L35) connecting terminals 3 and 4.

The representation of FIG. 5 enables illustrating the path of D.C. component Vp towards terminals 3 and 4. In this embodiment, the positive electrode of source 36 is connected to a midpoint of inductance L31. In this case, the current flows to terminal 3 from source 36, from its positive electrode through half-inductance L31. For terminal 4, the current flows through half-inductance L31 and through inductance L34 to reach terminal 4. Capacitor C31 avoids for the D.C. biasing component to reach terminal 5.

Figure 6:
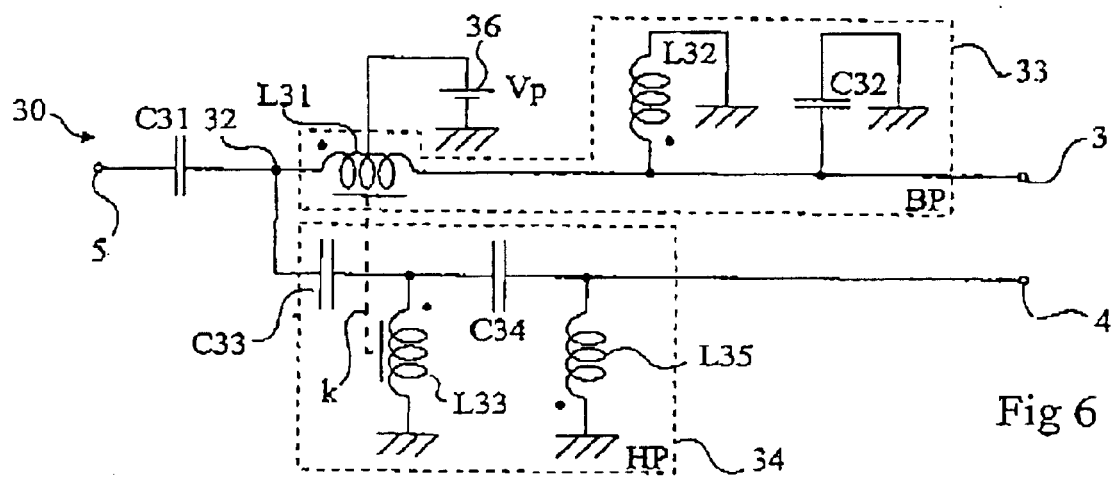
FIG. 6 illustrates the electric diagram of the transformer of FIG. 4 in dynamic operation.

FIG. 6 shows the diagram of mode switching transformer 30 of FIGS. 4 and 5 in a third representation showing the dynamic operation. Coupling k between inductances L31 and L33 is also shown in a dotted line. However, inductance L34 has been dissociated between two inductances L32 and L35 respectively connecting terminals 3 and 4 to ground 2.

The value of inductance L32 contributes to setting the central frequency of the band-pass filter. The value of inductance L33 sets the first order of high-pass filter 34 while inductance L35 sets its second order. Line L34 thus conditions the central frequency of filter 33 and the second order of filter 34.

Inductance L31 does not intervene on the band-pass filter response except to shift its central frequency towards the central frequency of the high-pass filter. Further, inductance L31 is used as an isolation on the band-pass filter line.

Figure 7:
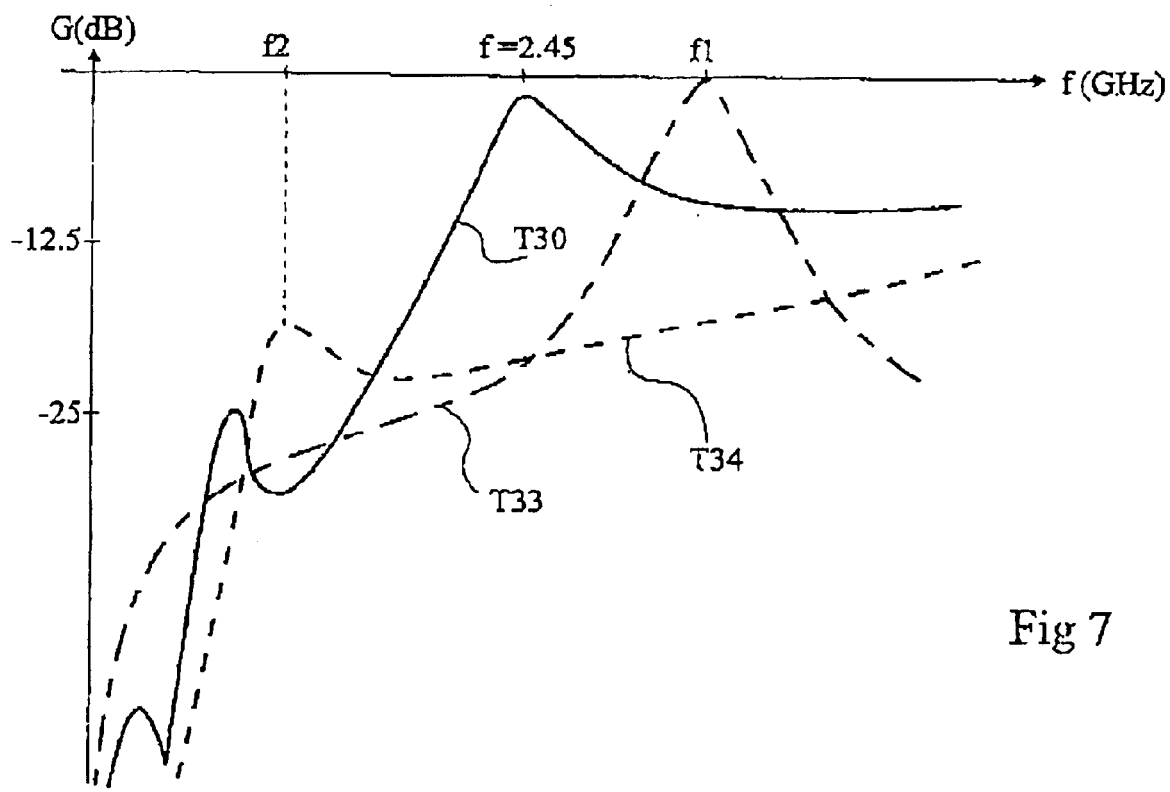
FIG. 7 illustrates the frequency response of the mode-switching transformer described in relation with FIGS. 4 and 6.

FIG. 7 illustrates the frequency response of the mode-switching transformer according to the present invention. The respective responses of the band-pass and high-pass filters considered separately are shown in the form of stripe-dot line T33 and dotted line T34. The global response is illustrated in full line T30. As illustrated in FIG. 7, central frequency f of the mode-switching transformer (in this example, 2.45 GHz) ranges between cut-off frequency f2 of the high-pass filter and central frequency f1 of the band-pass filter. The interval between frequencies f1 and f2 depends on the phase of each filter as well as on coupling k.

To guarantee a proper coupling, central frequency f1 of the band-pass filter is preferably smaller than 1.5 times central frequency f of the desired mode-switching transformer. Cut-off frequency f2 of the high-pass filter is preferably greater than 0.5 times central frequency f of the desired mode-switching transformer.

The respective frequencies f1 and f2 of the filters are determined by formula $\frac{1}{2}\pi\sqrt{LC}$ for frequency f1 and for the cut-off frequency of the first stage of the high-pass filter, the cut-off frequency of the second stage being imposed (since one element is in common with the band-pass filter).

Inductance L31 enables minimizing the amplitude difference between the two paths towards terminals 4 and 5. In its absence, this amplitude balance is difficult since the path of the band-pass filter exhibits an attenuation always smaller than the path of the high-pass filter (see FIG. 6).

Further, in an integrated implementation, the coupling reduces the size of the mode-switching transformer since it enables superposing the two inductances L31 and L33 made in the form of conductive tracks (in two metallization levels separated by a dielectric).

For the implementation of the present invention, the following sizing steps may for example be followed.

A band-pass filter of frequency f1 slightly greater than the frequency f aimed at is first designed. Then, a high-pass filter of frequency f2 slightly smaller than the frequency f aimed at is designed, and it is provided for the input impedances of the two filters to be conjugated complex impedances and for their putting in parallel to be equivalent to a matched impedance (for example, 50 real ohms).

The components are finally adapted, for example, by means of digital simulation tools, to adjust the performances especially in terms of amplitude coupling, of insertion losses, and of balance of the amplitude and phase differential paths.

As a specific example of embodiment, for a mode-switching transformer centered on a frequency on the order of 2.45 GHz, the components may be sized as follows:

L31=3.82 nanohenries;

L33=3.82 nanohenries;

k between 31 and 33=−0.7;

C31=31.7 picofarads;

C33=20.1 picofarads;

C32=6.32 picofarads; and

L34=0.79 nanohenries.

In such an embodiment, it can be seen that the value of inductance L34 is compatible with its implementation in the form of a transmission line. Accordingly, a single coupled inductance L31 and L32 and four capacitors are sufficient to form the mode-switching transformer. The surface area in an integrated embodiment is thus particularly reduced.

An advantage of the present invention is that it enables forming a frequency-selective mode-switching transformer which has particularly high performances.

Another advantage of the present invention is that it enables respecting the 180° phase shift and an identical amplitude between the two differential paths in the entire transformer passband.

Another advantage of the present invention is that the biasing does not require two additional inductive elements.

Of course, the present invention is likely to have various alterations, modifications, and improvements which will readily occur to those skilled in the art. In particular, the sizing of the filters according to the application and especially to the desired frequency will have to be adapted to the specific case and currently available simulation tools will enables those skilled in the art to optimize the structure.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A balun transformer selective on a band centered on a first frequency, comprising, between a same common mode input/output terminal and respectively one of two differential mode input/output terminals:
   a high-pass filter with a cut-off frequency smaller than said first frequency; and
   a band-pass filter with a central frequency greater than said first frequency.

2. The transformer of claim 1, wherein the two filters are connected by an inductive coupling.

3. The transformer of claim 1, wherein the high-pass filter is of the second order.

4. The transformer of claim 1, wherein the central frequency of the band-pass filter is smaller than 1.5 times said first frequency.

5. The transformer of claim 1, wherein the cut-off frequency of the high-pass filter is greater than 0.5 times the first frequency.

6. The transformer of claim 1, wherein the band-pass filter comprises, between an input terminal of the filter and one of said differential mode input/output terminals, a first inductance, a second inductance being in parallel with a first capacitor between said input/output terminal and the ground.

7. The transformer of claim 6, wherein the high-pass filter comprises:
   a first capacitor having a first electrode connected to an input terminal of the filter and a second electrode connected, by a first inductance, to ground; and
   a second capacitor having a first electrode connected to the junction point of the first capacitor and of the first inductance and having a second electrode connected to one of said differential mode input/output terminals and, by a second inductance, to ground.

8. The transformer of claim 7, wherein the first inductances of the band-pass and high-pass filters are coupled together and have a same value.

9. The transformer of claim 7, wherein the second inductances of the band-pass and high-pass filters are formed by a transmission line, the value of which conditions the central frequency of the band-pass filter.

10. The transformer of claim 9, wherein the value of the second inductance of the high-pass filter is a function of the cut-off frequency expected for this filter.

11. The transformer of claim 7, wherein the input terminal of the filters is common.

* * * * *